United States Patent [19]

Peavey et al.

[11] 4,452,333

[45] Jun. 5, 1984

[54] SPEAKER SYSTEM

[75] Inventors: Hartley D. Peavey; Robert M. O'Neill, both of Meridian, Miss.

[73] Assignee: Peavey Electronics Corp., Meridian, Miss.

[21] Appl. No.: 383,336

[22] Filed: May 28, 1982

[51] Int. Cl.³ .............................................. H05K 5/00

[52] U.S. Cl. ..................................... 181/144; 181/199

[58] Field of Search ................................ 181/141-147, 181/199; 312/7.1

[56] References Cited

U.S. PATENT DOCUMENTS

| | | | |
|---|---|---|---|
| 3,090,462 | 5/1963 | Huff et al. | 181/145 |
| 3,213,961 | 10/1965 | Kuypers et al. | 181/145 |
| 3,233,696 | 2/1966 | Mercuoius | 181/145 |
| 3,918,551 | 11/1975 | Rizo-Putrow | 181/141 |
| 4,014,597 | 3/1977 | Griffin, Jr. | 312/7.1 |

FOREIGN PATENT DOCUMENTS 44-32450 12/1969 Japan .

*Primary Examiner*—Benjamin R. Fuller
*Attorney, Agent, or Firm*—Berman, Aisenberg & Platt

[57] ABSTRACT

A speaker system comprises a main cabinet and two auxiliary speakers. The main cabinet encloses a bass speaker and includes a slot for slot-loading of the bass speaker. The auxiliary speakers have a frequency range higher than that of the bass speaker, and are in enclosures which fit within slots in the main cabinet.

The system provides a high-quality speaker system which is easily transported by placing of the auxiliary speaker in a slot.

12 Claims, 4 Drawing Figures

SPEAKER SYSTEM

THE TECHNICAL FIELD

This invention relates to the art of speaker systems, particularly portable systems for amplifying the sound from musical instruments.

THE BACKGROUND ART

Speaker systems having a plurality of separable speakers are known in the art. The U.S. Pat. No. 4,014,597 to Griffin, Jr., teaches a speaker system having main speakers and monitor speakers. The main speakers are contained in a large cabinet, and the monitor speakers are contained in smaller cabinets which are separate from the main speaker cabinet. The main speaker cabinet has cavities for receiving the monitor speakers when the entire system is to be transported. Monitor speakers are used to provide the musician with a speaker for monitoring his performance. In one embodiment, shown in FIGS. 5–7, the Griffin system employs a folded design for the main speaker. In this arrangement the main speaker faces toward the rear of the cabinet and angled faces within the cabinet reflect the sound toward the front of the cabinet. The cabinets of Griffin are arranged as triangles so that the combination of two of them produces a rectangular cabinet.

The U.S. Pat. No. 3,213,961 to Kuypers et al. shows a speaker system wherein a central speaker has a low frequency range, and each of two additional speakers has a high frequency response. The system is designed for stereophonic effect and relies upon the principle that the human ear is not direction-sensitive to low-frequency sounds.

The Japanese Pat. No. 44-32450 teaches a speaker system having a speaker mounted in a small cabinet which fits within a larger cabinet containing a bass speaker. The main purpose of this arrangement is to allow a change from a bass reflex system to an infinite baffle system, by moving the smaller speaker.

STATEMENT OF THE INVENTION

Portable speaker systems, such as those systems used for public performances of musical groups, must be convenient to transport, and of high quality. A typical performance requires a number of speakers, with at least one speaker placed at each side of a stage or platform. Conventional speaker systems typically use two full-range enclosures having individual speakers with appropriate crossovers.

Small physical size is a primary requirement for sound systems for use in small rooms and lounges. Small stage areas require sound systems which are designed to use a minimum amount of stage area.

The present invention provides an extremely convenient speaker system which is easily portable and which provides speakers of high quality. The main speaker cabinet includes a slot-loaded bass speaker. The slot-loading feature provides for an increase in output of about 8 db in the low-frequency range, where attenuation would normally begin if the same loudspeaker were in a direct radiation configuration, and provides a low-profile bass speaker. Auxiliary speakers are provided which are placed at spaced locations on a stage. These auxiliary speakers have a high-frequency response to complement that of the main speaker, and each is of such a physical size that it fits within one of the slots of the main speaker cabinet. Thus, when transporting the speaker system of the invention, the auxiliary speakers are simply placed in respective slots in the main speaker cabinet and the combination is easily transported.

It is an objective of this invention to provide a speaker system which is of high quality and easily portable.

It is an object of this invention to provide a cabinet which includes a slot-loaded speaker and auxiliary speakers which fit into the slots.

It is an object of this invention to provide a speaker system having a slot-loaded speaker having a frequency range which is different from auxiliary speakers.

BRIEF DESCRIPTION OF INVENTION

DETAILED DESCRIPTION OF THE INVENTION

Figure 1:
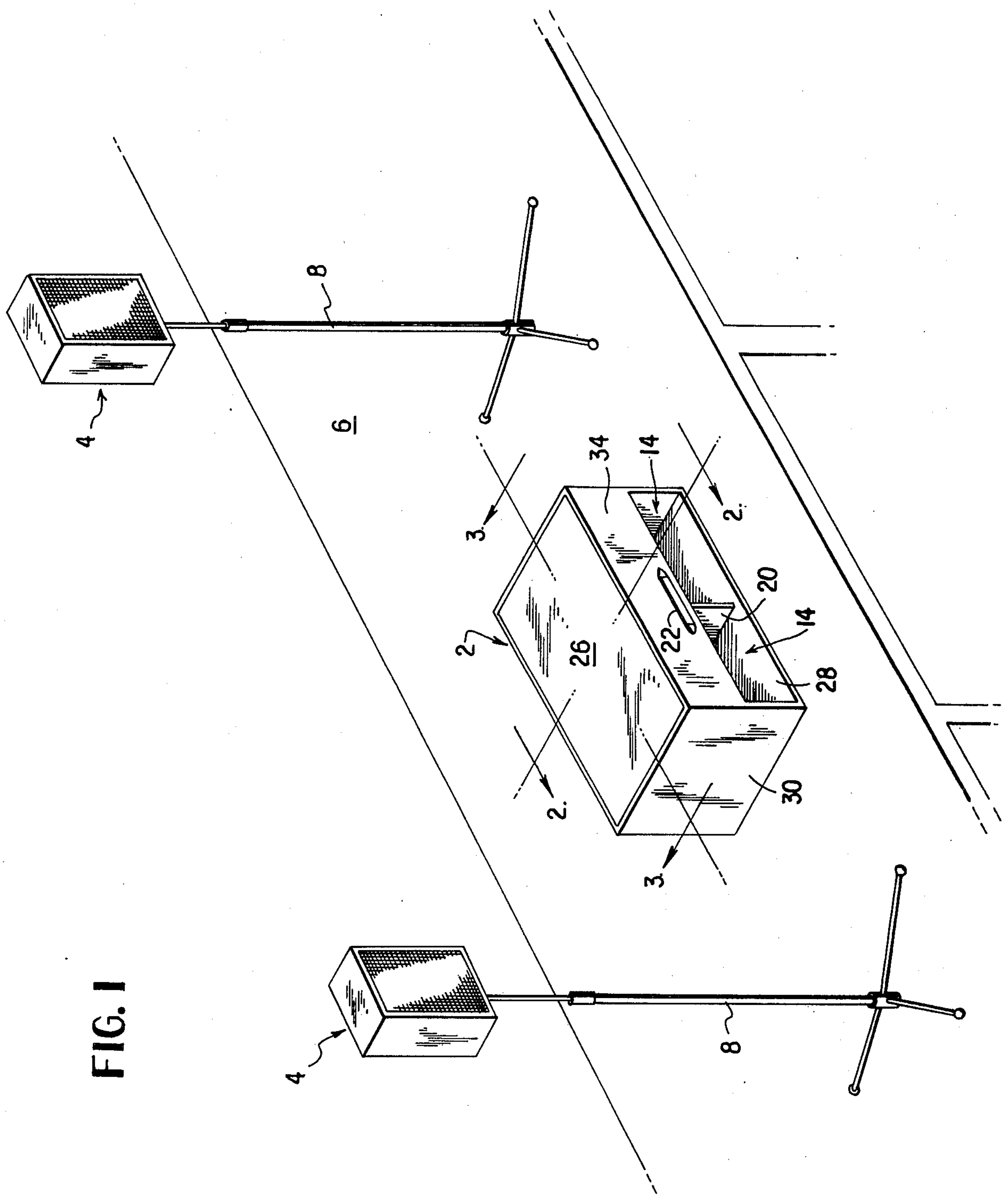
FIG. 1 shows a perspective view of the speaker system of the invention.

The speaker system according to the invention is shown generally in FIG. 1. The system comprises a main cabinet 2 and auxiliary speakers 4. The speakers are shown mounted on a stage 6. Auxilary speakers 4 may be supported by tripods 8.

Figure 2:
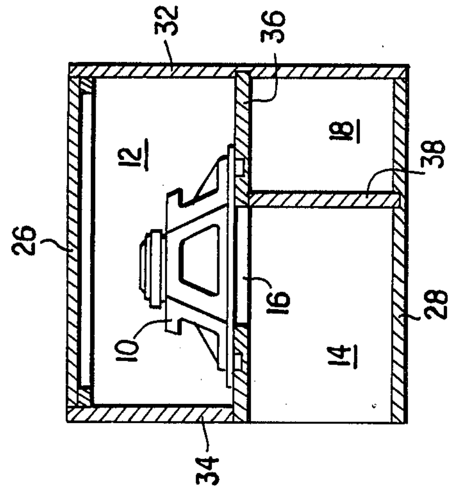
FIG. 2 shows an exploded diagram of the speaker system according to the invention with portions of the main cabinet being cut-away.

FIG. 2 shows the relationship between a speaker 10 contained in the main cabinet 2, and the internal structure of the cabinet. The speaker 10 is located in a rear volume 12 which is designed to cooperate with the characteristics of the speaker 10 to provide the proper resonance for the speaker. The speaker 10 is coupled to a slot 14 through a passageway 16. The slot 14 is of a predetermined volume, and the speaker is thus "slot-loaded." A cavity 18 is located behind the slot 14 and represents the difference between the volume of the entire cabinet 2 and the volumes required for the rear volume and the slot volume. Cavity 18 does not communicate with rear volume 12 or with slot 14.

Slot-loading is an important feature of this invention. While the slot-loading per se is known generally in the art, the particular arrangement of the slot with respect to the main cabinet, and the cooperation of the slot with the auxiliary speakers as disclosed herein, is not known in the art.

Figure 3:
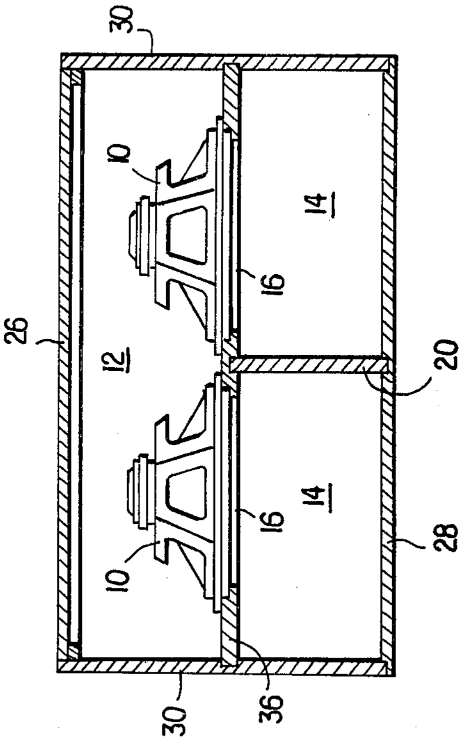
FIG. 3 shows a cross-section of the main speaker cabinet taken along line 3—3 of FIG. 1.

FIG. 3 shows a preferred embodiment of the invention having two speakers 10 and two slots 14. As may be seen from FIG. 3, each speaker 10 communicates with a single slot 14, and the slots are separated by a panel 20.

Figure 4:
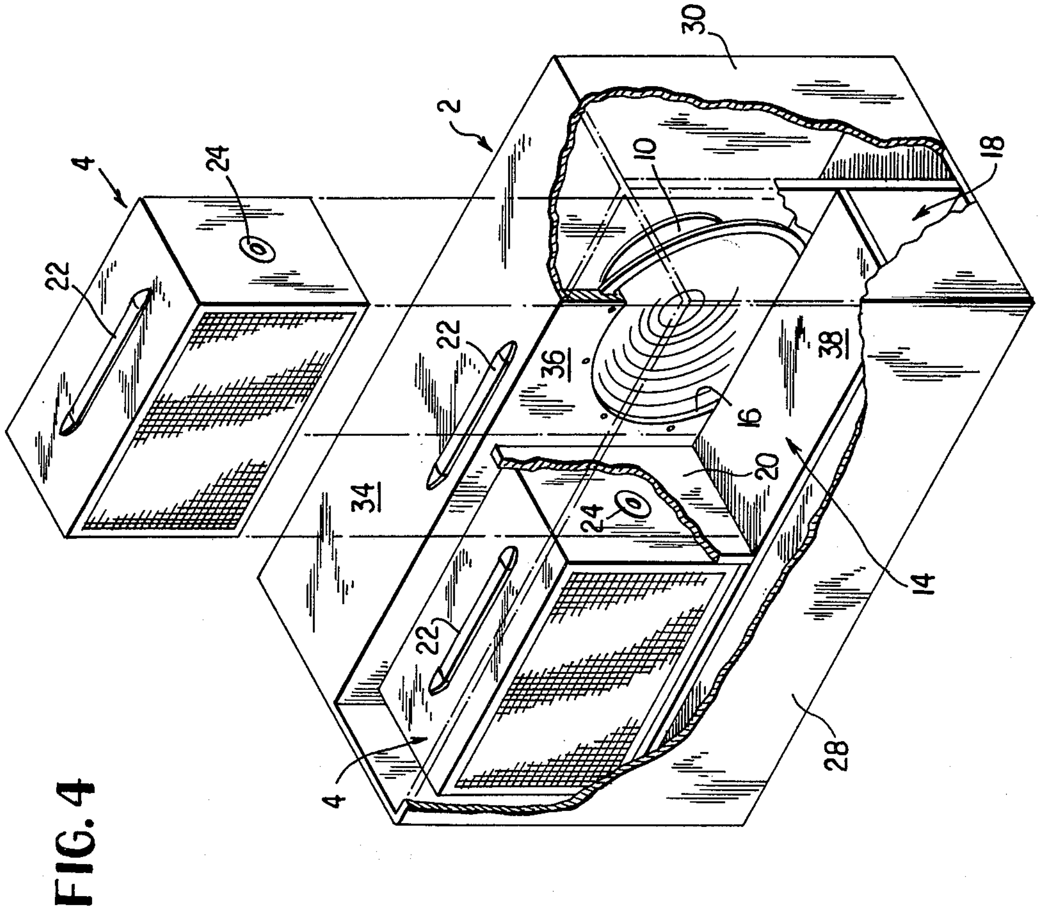
FIG. 4 shows a cross-section of the main speaker cabinet of the invention taken along line 4—4 of FIG. 1.

FIG. 4 shows how the slots 14 are designed to cooperate with the dimensions of the auxiliary speakers 4 so that each speaker 4 may be received in a respective slot 14. The main cabinet 2 and each of the auxiliary speakers 4 has a carrying handle 22. Each of the auxiliary speakers 4 may also have a socket 24 for receiving the tripod support.

The cabinet 2 has a top 26, a bottom 28 and sides 30. The cabinet also has a rear panel 32 and a front panel 34. The rear panel 32 extends along the entire height of the main cabinet, whereas the front panel 34 extends only partially along the height of the cabinet, leaving openings for the slots. The rear volume 12 is separated from the slot 14 and cavity 18 by a panel 36, which has a passageway 16, previously described. The slot 14 and the cavity 18 are separated by a panel 38.

Thus, there has been described a unique speaker system wherein slot-loading of the bass speaker is employed to provide both a high quality sound reproduction and a convenient means for transporting auxiliary speakers. The system is designed primarily so that the bass speaker, which is non-directional, may be placed in any convenient location near or on the stage, and the auxiliary speakers, having a higher frequency range, are placed at the edges of the stage. This arrangement relies upon the familiar phenomenon whereby the human ear is direction sensitive only to higher-frequency sounds, and thus any arbitrary location for the bass speaker that is on or in close proximity to the stage and a spaced location for the higher-frequency speakers is perceived as a fully coherent source. By providing slot-loaded bass speakers, the bandwidth of the bass speaker is increased and the cabinet has a low profile to not block the view of the performers on the stage. When the system is to be transported, the auxiliary speakers are placed in respective slots in the main cabinet. This system is then easily transported or stored.

What is claimed is:

1. A speaker system comprising:

(a) a first cabinet comprising an enclosure forming a first cavity having at least one speaker therein, said speaker having a first predetermined frequency range, said cabinet comprising at least a second enclosure forming at least one slot communicating with said speaker and containing a predetermined volume of air, and (b) at least one auxiliary speaker having a second predetermined frequency range which is different from said first frequency range, and contained in a second cabinet which has exterior dimensions such that said second cabinet will fit within said slot; whereby said auxiliary speaker may be stored in said slot.

2. The system of claim 1 wherein said first cavity provides a predetermined rear volume for said speaker, and said main cabinet includes a second cavity not communicating with either said slot or said first cavity, said second cavity having a volume which represents the difference between the total volume of said cabinet, and the volumes of rear volume and said slot.

3. The cabinet of claim 1, wherein said slot and said auxiliary speaker are rectangular.

4. The system of claim 1 wherein: the predetermined frequency range of said speaker is below about 250 Hz, and the predetermined frequency range of said auxiliary speaker is above about 250 Hz.

5. The system of claim 4, wherein said first cabinet includes two speakers and said cabinet forms two slots, and further including two auxiliary speakers.

6. The system of claim 5 wherein said first cabinet and each of said auxiliary speakers has a handle for aid in carrying said cabinet and said auxiliary speakers.

7. The system of claim 2 wherein said first cabinet includes a first wall between said slot and said second cavity, wherein the distance between said wall and a front panel of said cabinet, containing an opening for said slot, is approximately equal to the width of said second cabinet.

8. The system of claim 7 wherein said cabinet includes a second wall separating two of said slots, and wherein the distance between said second wall and the side of the cabinet is approximately equal to the height of said second cabinet.

9. The system of claim 8 wherein said cabinet includes a third wall separating said rear volume from said slot, wherein the distance between said third wall and a bottom of said cabinet is approximately equal to the depth of said second cabinet.

10. A speaker system according to claim 1 wherein the first cavity and one slot have a common wall therebetween, the common wall having an opening therethrough to allow sound waves from a speaker in the first cavity to pass freely and directly into the one slot.

11. A speaker system according to claim 10, wherein the speaker in the first cavity is mounted on the common wall between the first cavity and the one slot in a way that allows sound waves produced by the speaker to pass through the opening in the common wall freely and directly into the one slot.

12. A speaker system according to claim 1, wherein the first cavity and one slot have a common wall therebetween, the speaker is mounted on the common wall and the one slot communicates directly with the speaker.

* * * * *